(12) United States Patent
Mellott

(10) Patent No.: US 8,965,943 B2
(45) Date of Patent: *Feb. 24, 2015

(54) METHOD AND APPARATUS FOR PERFORMING COMPUTATIONS USING RESIDUE ARITHMETIC

(75) Inventor: Jonathon D. Mellott, Gainesville, FL (US)

(73) Assignee: The Athena Group, Inc., Gainesville, FL (US)

( * ) Notice: Subject to any disclaimer, the term of this patent is extended or adjusted under 35 U.S.C. 154(b) by 147 days.

This patent is subject to a terminal disclaimer.

(21) Appl. No.: 13/471,197

(22) Filed: May 14, 2012

(65) Prior Publication Data

US 2012/0284319 A1 Nov. 8, 2012

Related U.S. Application Data

(63) Continuation of application No. 12/407,271, filed on Mar. 19, 2009, now Pat. No. 8,180,821, which is a continuation of application No. 09/569,944, filed on May 12, 2000, now Pat. No. 7,523,151.

(51) Int. Cl.
*G06F 7/38* (2006.01)
*H03M 7/18* (2006.01)
*G06F 7/72* (2006.01)

(52) U.S. Cl.
CPC ...... *H03M 7/18* (2013.01); *G06F 7/729* (2013.01)
USPC .......................................................... 708/491

(58) Field of Classification Search
None
See application file for complete search history.

(56) References Cited

U.S. PATENT DOCUMENTS

| | | | |
|---|---|---|---|
| 3,609,328 A | 9/1971 | Kieburtz | |
| 4,107,783 A | 8/1978 | Huang | |
| 4,281,391 A | 7/1981 | Huang | |
| 4,363,106 A | 12/1982 | Tai | |
| 4,506,340 A | 3/1985 | Circello et al. | |
| 4,709,345 A | 11/1987 | Vu | |
| 4,948,959 A | 8/1990 | Houk et al. | |
| 4,949,294 A * | 8/1990 | Wambergue | 708/491 |
| 5,008,668 A | 4/1991 | Takayama et al. | |

(Continued)

FOREIGN PATENT DOCUMENTS

| | | |
|---|---|---|
| EP | 0795819 | 9/1997 |
| GB | 2 201 854 | 2/1987 |

(Continued)

OTHER PUBLICATIONS

Gary A. Ray, "Residue Computations in Rings of Algebraic Integers", 1990, IEEE, p. 1527-1530.

(Continued)

*Primary Examiner* — Michael D Yaary
(74) *Attorney, Agent, or Firm* — Saliwanchik, Lloyd & Eisenschenk

(57) ABSTRACT

The subject invention pertains to a method and apparatus for performing computations using residue arithmetic. The subject method and apparatus can utilize logic gates for performing calculations such as multiplication by a constant, computing a number theoretic logarithm of a residue for a given base $\alpha_i$ and modulus $p_i$, and computing the product of two residues, modulo $p_i$. The use of logic gates can offer advantages when compared with the use of ROMs for table look-up functions in integrated RNS digital signal processor implementations.

7 Claims, 9 Drawing Sheets

(56) References Cited

U.S. PATENT DOCUMENTS

| | | |
|---|---|---|
| 5,077,793 A | 12/1991 | Falk et al. |
| 5,107,451 A | 4/1992 | Houk |
| 5,117,383 A | 5/1992 | Fujita et al. |
| 5,361,221 A | 11/1994 | Fujita |
| 5,424,971 A | 6/1995 | Yang et al. |
| 5,619,535 A | 4/1997 | Alvarez, Jr. |
| 5,987,487 A | 11/1999 | Welland |
| 6,195,386 B1 | 2/2001 | Oh |

FOREIGN PATENT DOCUMENTS

| | | |
|---|---|---|
| JP | S61-271536 A | 12/1986 |
| JP | H10-021057 A | 1/1998 |

OTHER PUBLICATIONS

Paliouras et al., "Multifunction Archetictures for RNS Processors", Aug. 1999, IEEE Transactions on Circuits and Systems-II: Analog and Digital Singal Processing, vol. 46, No. 8, p. 1041-1054.

Smith, Jeremy C., Fred J. Taylor, (1995) "A Fault-Tolerant GEQRNS Processing Element for Linear Systolic Array DSP Applications", IEEE Transactions on Computers 44(9): 1121-1130.

Daniels, J.D., *Digital Design from Zero to One*, 1996, John Wiley & Sons, New York, NY, pp. 88-89, 199.

Garner, H.L., "The Residue Number System," *IRE Transactions on Electronic Computers*, Jun. 1959, pp. 140-147, vol. EC-8, No. 2.

Griffin, M., et al., "New Scaling Algorithms for the Chinese Remainder Theorem," $22^{nd}$ Asilomar Conference on Signals, Systems and Computers, Oct. 31, 1988, pp. 375-378, vol. 1.

Iwamura, K., et al., "A Study on High-Speed RSA Encryption Hardware," *Technical Research Report of the Institute of Electronics, Information and Communication Engineers*, Japan, Mar. 8, 1991, pp. 25-32, vol. 90, No. 460.

Kim, S.W., et al., "New Implementations of Converters for the Residue and Quadratic Residue Number System," *Proceedings of the IEEE International Symposium on Circuits and Systems*, Jun. 11, 1991, pp. 2959-2962, vol. 5.

Meehan, S.J., et al., "An Universal Input and Output RNS Converter," *IEEE Transactions on Circuits and Systems*, Jun. 1990, pp. 799-803, vol. 37, No. 6.

Mellott, J.D., et al., "ASAP—A 2D DFT VLSI Processor and Architecture," *Proceedings of the IEEE International Conference on Acoustics, Speech, and Signal Processing*, 1996, Atlanta, GA, pp. 3280-3283, vol. 6.

Mellott, J.D., et al., "The Gauss Machine: A Galois-Enhanced Quadratic Residue Number System Systolic Array," *Proceedings of the IEEE $11^{th}$ Symposium on Computer Arithmetic*, 1993, Windsor, ON, pp. 156-162.

Smith, J.C., et al., "The Design of a Fault Tolerant GEQRNS Processing Element for Linear Systolic Array DSP Applications," *Proceedings of the IEEE $4^{th}$ Great Lakes Symposium on Design Automation of High Performance VLSI Systems*, 1994, Notre Dame, IN, pp. 46-49.

Taylor, F.J., "Residue Arithmetic: A Tutorial with Examples," *IEEE Computer*, May 1984, pp. 50-62, vol. 17, No. 5.

Tietze, U., et al., "Halbleiter-Schaltungstechnik," 1993, Springer-Verlag, Berlin, p. 224.

\* cited by examiner

METHOD AND APPARATUS FOR PERFORMING COMPUTATIONS USING RESIDUE ARITHMETIC

CROSS-REFERENCE TO RELATED APPLICATION

The present application is a continuation of U.S. application Ser. No. 12/407,271, filed Mar. 19, 2009, which is a continuation of U.S. application Ser. No. 09/569,944, filed May 12, 2000, which is hereby incorporated by reference herein in its entirety, including any figures, tables, or drawings.

The subject invention was made with government support under a research project supported by the National Institutes Standards and Technology Cooperative Agreement No. FONANB7H3021. The government may have certain rights in this invention.

BACKGROUND OF THE INVENTION

The subject invention relates to a method and apparatus for performing computations using residue arithmetic. The subject method and apparatus can utilize the Residue Number System (RNS) to implement automatic computing machinery. The use of the RNS has been proposed in Garner, H. L., "The Residue Number System," *IRE Transactions on Electronic Computers*, vol. EL-8, No. 6, Jun. 1959, pp. 140-147, and Taylor, F. J., "Residue Arithmetic: A Tutorial with Examples," *IEEE Computer*, vol. 17, No. 5, May 1984, pp. 50-61. The RNS is generally used to implement automatic computing machinery for digital signal processing. Digital signal processing (DSP) is dominated by the repetitive computation of sums of products. The RNS is well-suited to performing computations of this type, as demonstrated in Mellott, J. D., Lewis, M. P., Taylor, F. J., "A 2D DFT VLSI Processor and Architecture," *Proceedings of IEEE International Conference on Acoustics, Speech, and Signal Processing*, Atlanta, 1996, and Mellott, J. D., Smith, J. C., Taylor, F. J., "The Gauss Machine—A GaloisEnhanced Quadratic Residue Number System Systolic Array," *Proceedings of IEEE 11th Symposium on Computer Arithmetic*, Windsor Ontario, 1993, pp. 156-162.

In the past, it has often been impractical to implement large-scale digital signal processors using a single semiconductor device due to the limitations of the amount of logic that can be placed on such a device. Instead, large-scale digital processors were typically implemented using discrete logic. The RNS is well-suited to this implementation methodology since its need for small adders and table lookup functions corresponds with the common availability of discretely packaged small adders and small programmable read-only memories (PROMs). An example of this implementation methodology is the Gauss Machine, discussed in the aforementioned reference by Mellott, et al. As it became possible to integrate large-scale digital signal processors onto a single semiconductor device, the methodology of using small adders and memories was carried forward. An example of such a digital signal processor is given by Smith, J. C., Taylor, F. J., "The Design of a Fault Tolerant GEQRNS Processing Element for Linear Systolic Array DSP Applications," *Proceedings of IEEE Great Lakes Symposium on VLSI*, Notre Dame, Ind., 1994. Other examples of RNS digital signal processors can be found in U.S. Pat. No. 5,117,383 (Fujita et al.), issued May 26, 1992; U.S. Pat. No. 5,008,668 (Takayama, et al.), issued Apr. 16, 1991, U.S. Pat. No. 4,949,294 (Wambergue), issued Aug. 14, 1990; and U.S. Pat. No. 4,281,391 (Huang), issued Jul. 28, 1981.

The aforementioned examples disclose the use of ROMs for implementation of table lookup functions. For the small table lookup functions typically found in RNS digital signal processor implementations, ROMs are attractive because they are easy to program and have known speed, area, and power characteristics. In contrast, the manual design of a collection of logic gates to realize a table lookup function can be a daunting task, and the speed, area, and power characteristics are generally not fully known until the time that the circuit is designed. Another feature associated with prior use of ROMs in integrated, as opposed to discrete, RNS digital signal processor implementations is that the ROMs offer favorable die area compared to other possible means of implementing small table lookups.

Prior techniques for performing computations using RNS suffer from one or more disadvantages related to the use of memories, usually ROMs, to implement table lookup functions. Some of these disadvantages include: memories with the required properties for use in RNS computations are not available in sufficient quantity in all ASIC implementation technologies; memories often contain analog circuitry that uses significant power even if there is no switching activity in the circuit; the analog circuitry found in most memory devices does not scale well into deep sub-micron semiconductor fabrication technologies; memories, since they are dependent upon analog circuits (e.g., differential amplifiers), can be more difficult to test than digital logic circuits, can require separate tests and test mechanisms than digital logic circuits, and are not generally compatible with leakage current ($I_{DDQ}$) test methodologies; there is little or no flexibility to optimize a memory with respect to one or more of speed, power, and area; memories can be difficult to pipeline, and in many implementation technologies there is no realistic option to pipeline memory; the size of the memory is typically fixed by the number of inputs and outputs, and is essentially independent of the contents of the memory; for reliability reasons, wires unrelated to a memory are not usually allowed to pass over a memory on a semiconductor device, such that the presence of many small memories on a semiconductor device, such as would be used in an apparatus to perform computations using the RNS, can impair the ability to connect various functions, both memory and non-memory, on the device.

BRIEF SUMMARY OF THE INVENTION

The subject invention pertains to a method and apparatus for performing computations using the Residue Number System (RNS). In a specific embodiment, a plurality of logic gates can be utilized to implement computations using the RNS. In light of recent semiconductor device scaling and design methodology changes, the subject invention can offer advantages over the use of ROMs for small table lookup functions in integrated RNS digital signal processor implementations. Some of these advantages include: logic gates can scale down in size or power better than the analog portions of the ROM circuitry, for example the differential sense amplifier; for integrated RNS implementations, small table lookup functions implemented with gates require less die area than the same functions implemented with ROMs; in general, logic gates are compatible with quiescent current test methodologies, while memory devices are not compatible with quiescent, or leakage, current test methodologies (also known as $I_{DDQ}$ testing); logic gates are generally scan testable whereas memory devices can require special test structures and are typically not directly compatible with scan test methodologies; and signal wires may be routed over logic gates, whereas most design methodologies do not allow signal wires to be routed over on-chip memories such that the presence of many small memories in a design may congest wire routing, potentially leading to higher design costs, slower circuit operation, greater power consumption, greater silicon die area consumption, and, thus, greater manufacturing cost.

The present invention can provide one or more of the following advantages: provide a means of implementing residue arithmetic computational circuitry with a reduced use of, or entirely without the use of, memories for table lookup operations so that the circuitry can be easily implemented using a variety of technologies, including, but not limited to, custom digital logic, standard cell logic, cell-based arrays of logic, gate arrays, field programmable gate arrays, and programmable logic devices; provide a means of implementing residue arithmetic computational circuitry that does not consume significant power in the absence of switching activity in the circuit; to provide a means of implementing residue arithmetic computational circuitry that scales directly into deep sub-micron semiconductor fabrication technologies; to provide a means of implementing residue arithmetic computational circuitry that is compatible with standard logic test methodologies (e.g., scan, $I_{DDQ}$); provide a means of optimizing the mathematical functions in the residue arithmetic computational circuitry for one or more of speed, power, and area; provide a means of implementing the mathematical functions in residue arithmetic computational circuitry that allows pipelining and is fully compatible with Electronic Design Automation (EDA) methodologies for automatic pipelining; provide a means of implementing the mathematical functions in residue arithmetic computational circuitry that takes advantage of the structure of the values resulting from a mathematical function to produce an implementation that is smaller and faster than is possible with any memory-based implementation; and provide a means of implementing mathematical functions in the residue arithmetic computational circuitry that does not unduly interfere with the routing of wires or the semiconductor device.

DETAILED DESCRIPTION OF INVENTION

Enabling Mathematical Theory

Figure 1:
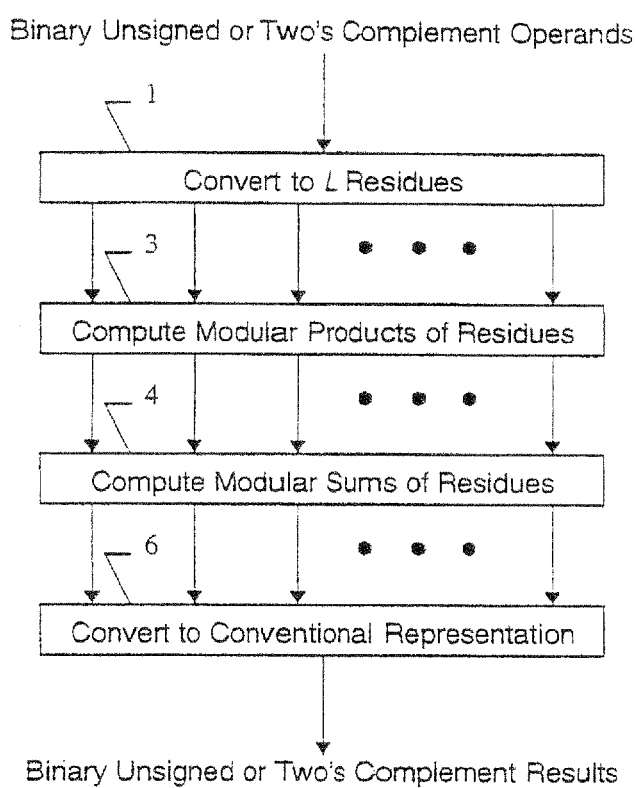
FIG. 1 shows a block diagram of an apparatus, for digital signal processing, that uses residue arithmetic to operate on real operands and produces real results.

The following subsections present the mathematics which are relevant to the operation of the invention. While the mathematics are well-known, the theory is presented here so as to provide a consistent framework of notation and symbols.

The Chinese Remainder Theorem

Let $S=\{p_0, p_1, p_2, \ldots, p_{L-1}\}$, where $\gcd(p_i, p_j)=1$ for all $i,j \in \{0, 1, 2, \ldots, L-1\}$ and $i \neq j$, wherein gcd stands for greatest common denominator. Let $M=\Pi_{i=0}^{L-1} p_i$, and let $X \in Z/MZ$, where Z denotes the ring of integers. By the Chinese Remainder Theorem, there exists an isomorphism $$\phi: Z/MZ \to Z/p_0Z \times Z/p_1Z \times Z/p_2Z \times \ldots \times Z/p_{L-1}Z.$$

The mapping $\phi$ is given by $$\phi(X)=(x_0, x_1, x_2, \ldots, x_{L-1})$$

where $(x_0, x_1, x_2, \ldots, x_{L-1}) \in Z/p_0Z \times Z/p_1Z \times Z/p_2Z \times \ldots \times Z/p_{L-1}Z$, and $x_i \equiv X \pmod{p_i}$ for all $i \in \{0, 1, 2, \ldots L-1\}$. The inverse mapping is given by $$\phi^{-1}[(x_0, x_1, x_2, \ldots, x_{L-1})] = X$$

where $$X \equiv \left( \sum_{i=0}^{L-1} m_i \langle m_i^{-j} x_i \rangle_{p_i} \right) \pmod{M},$$

$m_i = M/p_i$, $m_i m_i^{-1} \equiv 1 \pmod{p_i}$, and $(x)_p$ denotes the value in the set $\{0, 1, 2, \ldots, p-1\}$ that is congruent to X modulo p.

Number Theoretic Logarithms

If $p_i$ is prime then there exists a generator $\alpha_i \in Z/p_iZ$ such that $$\{\alpha_i^k | k=0, 1, 2, \ldots, p_i-2\} = \{1, 2, 3, \ldots, p_i-1\}$$

in the ring $Z/p_iZ$. If $x_i \in (Z/p_iZ) \setminus \{0\}$, then there exists a unique $l_{x_i} \in Z/(p_i-1)Z$, such that $$x_i \equiv \alpha_i^{l_{x_i}} \pmod{p_i}$$

The value $l_{x_i}$ is said to be the number theoretic logarithm of $x_i$ to the base $\alpha_i$ modulo $p_i$.

The number theoretic logarithm may be exploited to compute products in the ring $Z/p_iZ$. If $x_i, y_i \in (Z/p_iZ) \setminus \{0\}$, then there exist unique $l_{x_i}, l_{y_i} \in Z/(p_i-1)Z$, such that $$x_i y_i \equiv \left( \alpha_i^{l_{x_i}} \right) \left( \alpha_i^{l_{y_i}} \right) \pmod{p_i}$$

$$x_i y_i \equiv \alpha_i^{\langle l_{x_i}+l_{y_i} \rangle_{p_i-1}} \pmod{p_i}$$

$$x_i y_i \equiv f_{\alpha_i}\left( \langle l_{x_i} + l_{y_i} \rangle_{p_i-1} \right) \pmod{p_i}$$

If either or both of $x_i, y_i$ is zero, then the product $x_i y_i$ is zero.

Complex Arithmetic

Let $Z[j]/(f+1)$ denote the ring of Gaussian integers under the usual operations of addition and multiplication, numbers of the form $a+jb$ where $a,b \in Z$, and $f=-1$. Then $(Z[j]/(f+1))/p_iZ$, denotes the ring of Gaussian integers modulo $p_i$, and if $a+jb \in Z[j]/(f+1)$ then the mapping $\phi: Z[j]/(f+1) \rightarrow (Z[j]/(f+1))/p_iZ$ is given by $$\phi((a+jb)) \rightarrow a_i + jb_i,$$

where $a_i \equiv a \pmod{p_i}$ and $b_i \equiv b \pmod{p_i}$. The set $(Z[j]/(f+1))/p_iZ$ is a ring under the usual complex arithmetic operations of multiplication and addition. That is, if $(a_i+jb_i),(c_i+jd_i) \in (Z[j]/(f+1))/p_iZ$, then $$(a_i+jb_i)+(c_i+jd_i) = ((a_i+c_i)+j(b_i+d_i))$$

$$(a_i+jb_i) \times (c_i+jd_i) = ((a_ic_i-b_id_i)+j(a_id_i+b_ic_i)).$$

Suppose $p_i$ is a prime and $p_i=4k_i+1$, where $k_i \in Z$. Then there exists an isomorphism between the Gaussian integers modulo $p_i$ under the usual complex arithmetic operations as shown above, and the Gaussian integers modulo $p_i$ under component-wise addition and multiplication, $\Psi:(Z[j]/(f+1))/p_iZ \rightarrow (Z[j]/(f+1))/p_iZ$, with the mapping $$\Psi((a_i+jb_i)) \rightarrow (z_i,z_i^*)$$

where $z_i=a_i+\hat{j}b_i, z_i^*=a_i-\hat{j}b_i$, and $\hat{j}^2 \equiv -1 \pmod{p_i}$. The inverse mapping is given by $$\Psi^{-1}((z_i,z_i^*)) \rightarrow (a_i+jb_i)$$

where $a_i=2^{-1}(z_i+z_i^*), b_i=\hat{j}2^{-1}(z_i-z_i^*)$, and $2 \cdot 2^{-1} \equiv 1 \pmod{p_i}$.

The Chinese Remainder Theorem (CRT) may be exploited to perform addition, subtraction, and multiplication of values in the ring of integers modulo M, Z/MZ, by breaking the computation into L independent computations in $Z/p_iZ$, for $i \in \{0, 1, 2, \ldots, L-1\}$. If each $p_i \in S$ is prime then number theoretic logarithms may be exploited to reduce the complexity of multiplication. Furthermore, if each $p_i \in S$ is prime and $p_i=4k_i+1$ where $k_i \in Z$, then it is possible to exploit the isomorphism $\Psi$ to reduce the number of arithmetic operations required to implement complex multiplication from four real multiplies and two real additions to two real multiplies.

FIG. 1 shows a specific embodiment of the subject invention which can be used to perform sums of products on real binary unsigned or two's complement, one's complement, sign-magnitude, or other fixed-radix or floating-radix operands using residue arithmetic. The system shown in FIG. 1 can have a circuit 1 to convert data from a conventional representation such as, but not limited to, one's complement, sign-magnitude, unsigned binary or two's complement to a set of L residues. If multiplication is needed, the residues of the input operands can be multiplied by one or more coefficients by a circuit 3. Circuit 3 can be removed if only addition is to be achieved. These coefficients can be fixed and/or programmed coefficients. The modular products produced by circuit 3 can then be added by a circuit 4 to produce modular sums of products. The modular sums of products can then be converted to a conventional representation by a circuit 6. The specific arrangement of the modular products and sums are dependent upon the algorithm design and can be optimized as desired.

Figure 8:
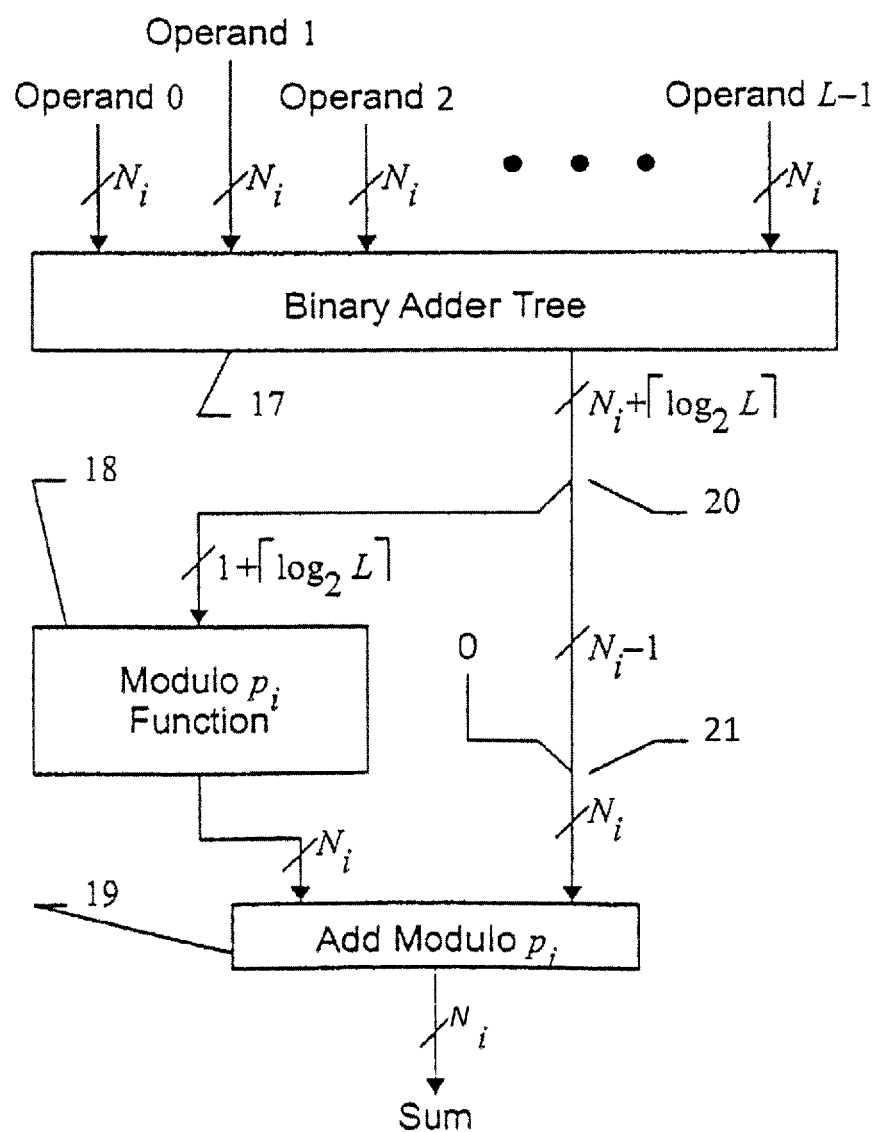
FIG. 8 shows a block diagram of a multi-operand modular adder tree.
Figure 9:
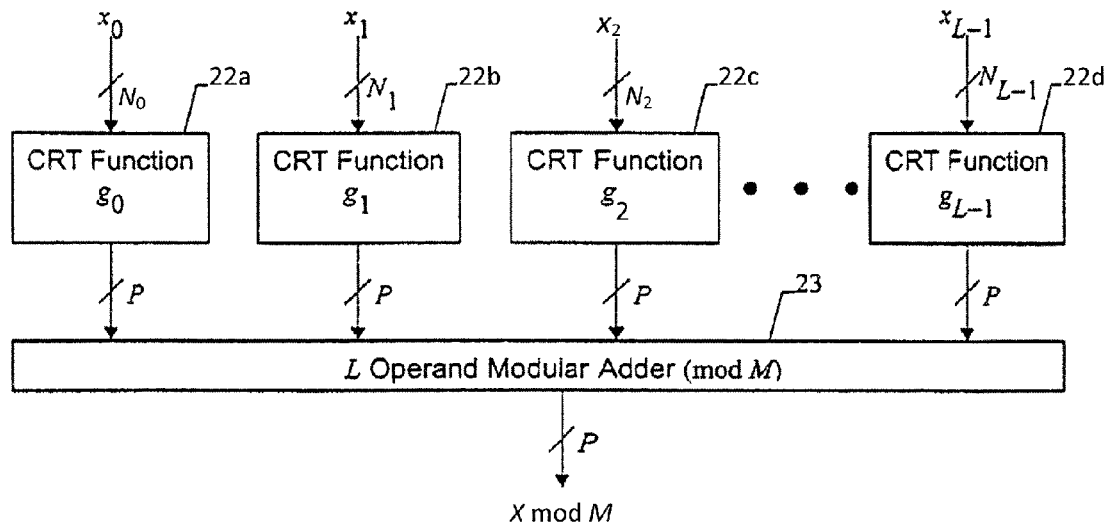
FIG. 9 shows a structure to convert a value from RNS representation to binary representation using the Chinese Remainder Theorem.
Figure 10:
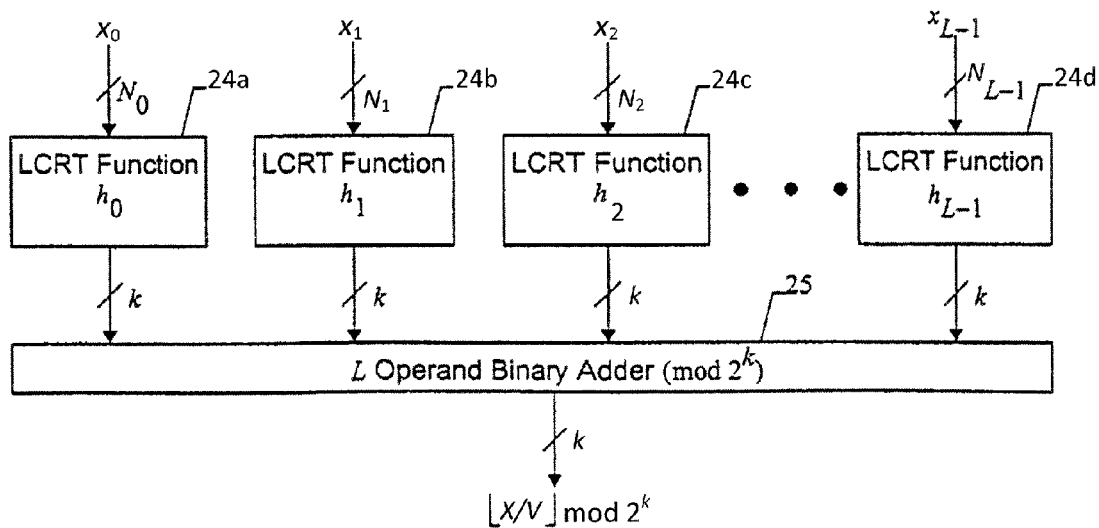
FIG. 10 shows a structure to convert a value from RNS representation to binary representation using the L-CRT algorithm

Referring to FIG. 1, an embodiment which can process real operands is shown. Data operands, for example, in a conventional format such as two's complement, can be input to circuit 1 (the details of which are summarized in the discussion of FIG. 7) to convert the operands into RNS form. If the algorithm requires multiplication, the products can be computed next by a circuit 3, which can comprise one or more elements from FIG. 3, and/or FIG. 5 and FIG. 6. Any sums, if required, can be computed next by a circuit 4, which comprises two operand modular adders and, optionally, one or more modular adder trees from FIG. 8. The specific arrangement of the arithmetic elements and intermediate storage elements, including, but not limited to, registers, latches, and random access memory (RAM)s, can be varied depending on the situation. For example, the arithmetic elements and intermediate storage elements may be arranged to implement functions including, but not limited to, convolution, correlation, finite impulse response filters, fast Fourier transforms, discrete cosine transforms, wavelet transforms, filter banks, cascaded integrator comb filters, digital receivers, and digital transmitters. The results of the computation can then be converted to a conventional format such as two's complement by a circuit 6, which can comprise, for example, a CRT conversion as shown in from FIG. 9 or an L-CRT conversion as shown in FIG. 10.

Figure 2:
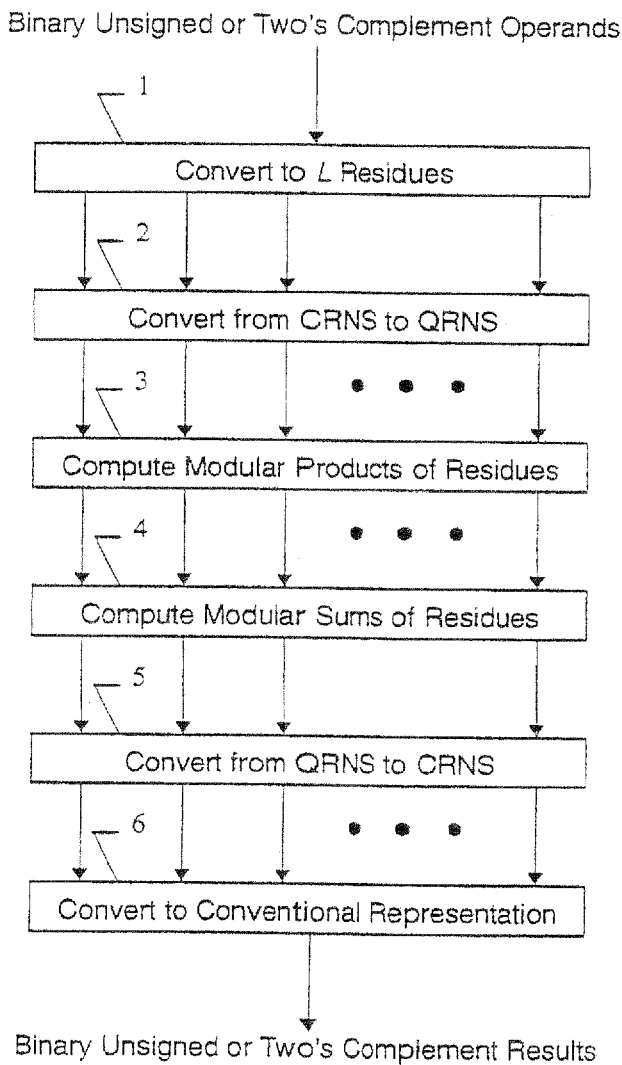
FIG. 2 shows a block diagram of an apparatus, for digital signal processing, that uses residue arithmetic to operate on complex operands and produces complex results.

FIG. 2 shows another specific embodiment of the subject invention which can be used to perform sums of products on complex binary unsigned or two's complement operands using residue arithmetic. The system shown in FIG. 2 can have a circuit 1 to convert data from a conventional representation such as, but not limited to, one's complement, sign-magnitude, unsigned binary, or two's complement to a set of L residues for each of the real and imaginary components of each operand. The complex residues can then be converted to quadratic residue representation by a circuit 2. The quadratic residues of the input operands can be multiplied by one or more coefficients by a circuit 3. These coefficients can be fixed and/or programmed coefficients. The modular products produced by circuit 3 can then be added by a circuit 4 to produce modular sums of products. The quadratic modular sums of products can then be converted to complex residues by a circuit 5. The complex sums of products can then be converted to a conventional representation, such as complex unsigned binary or two's complement, by a circuit 6. The specific arrangement of the modular products and sums are dependent upon the algorithm design and can be optimized as desired. In some instances, an algorithm can be designed to accept real inputs as operands and produce complex results, or to accept complex inputs and produce real results. In such case, the circuit 2 and/or the circuit 5 may be removed, as desired.

Figure 11:
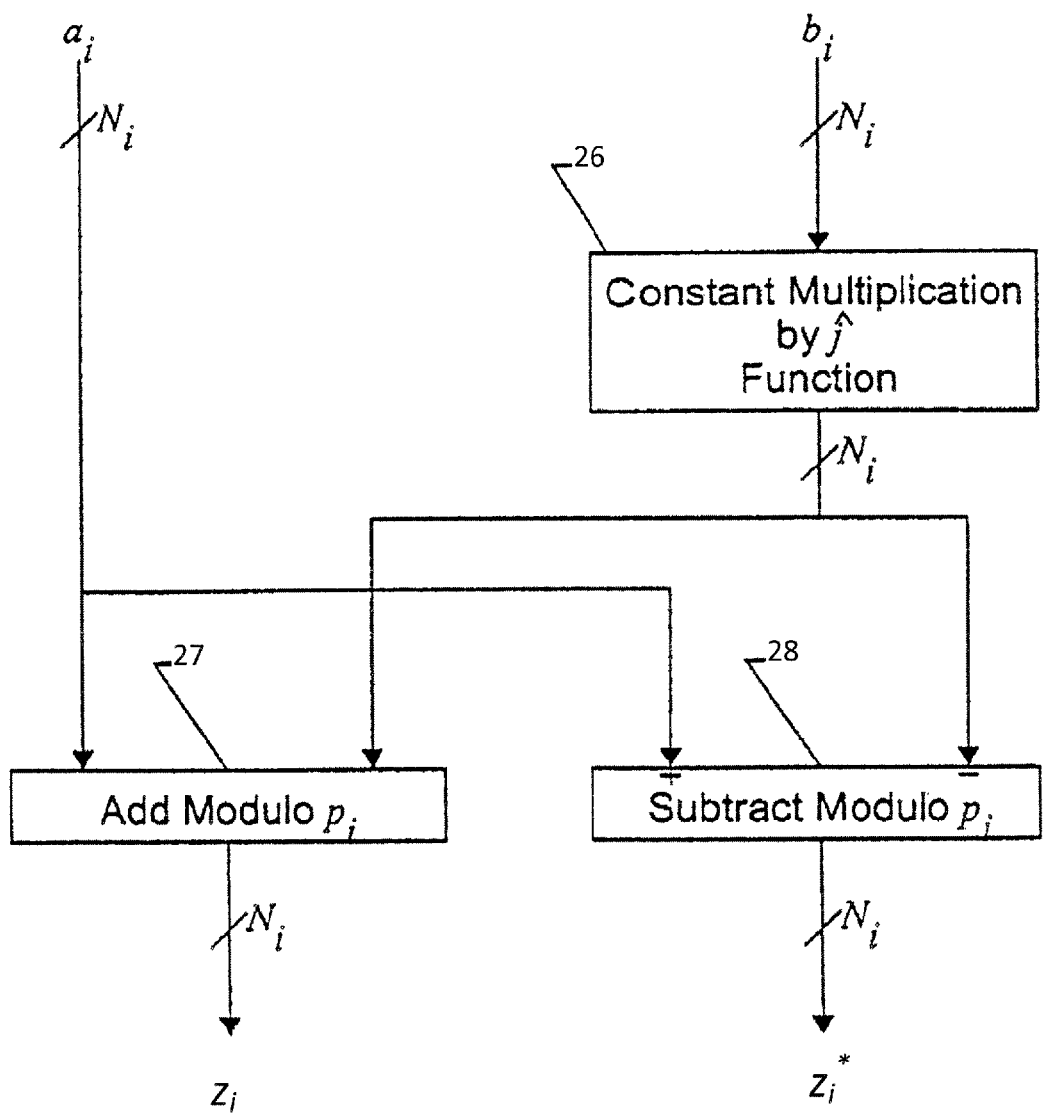
FIG. 11 shows a structure to convert a complex RNS value to a QRNS value.
Figure 12:
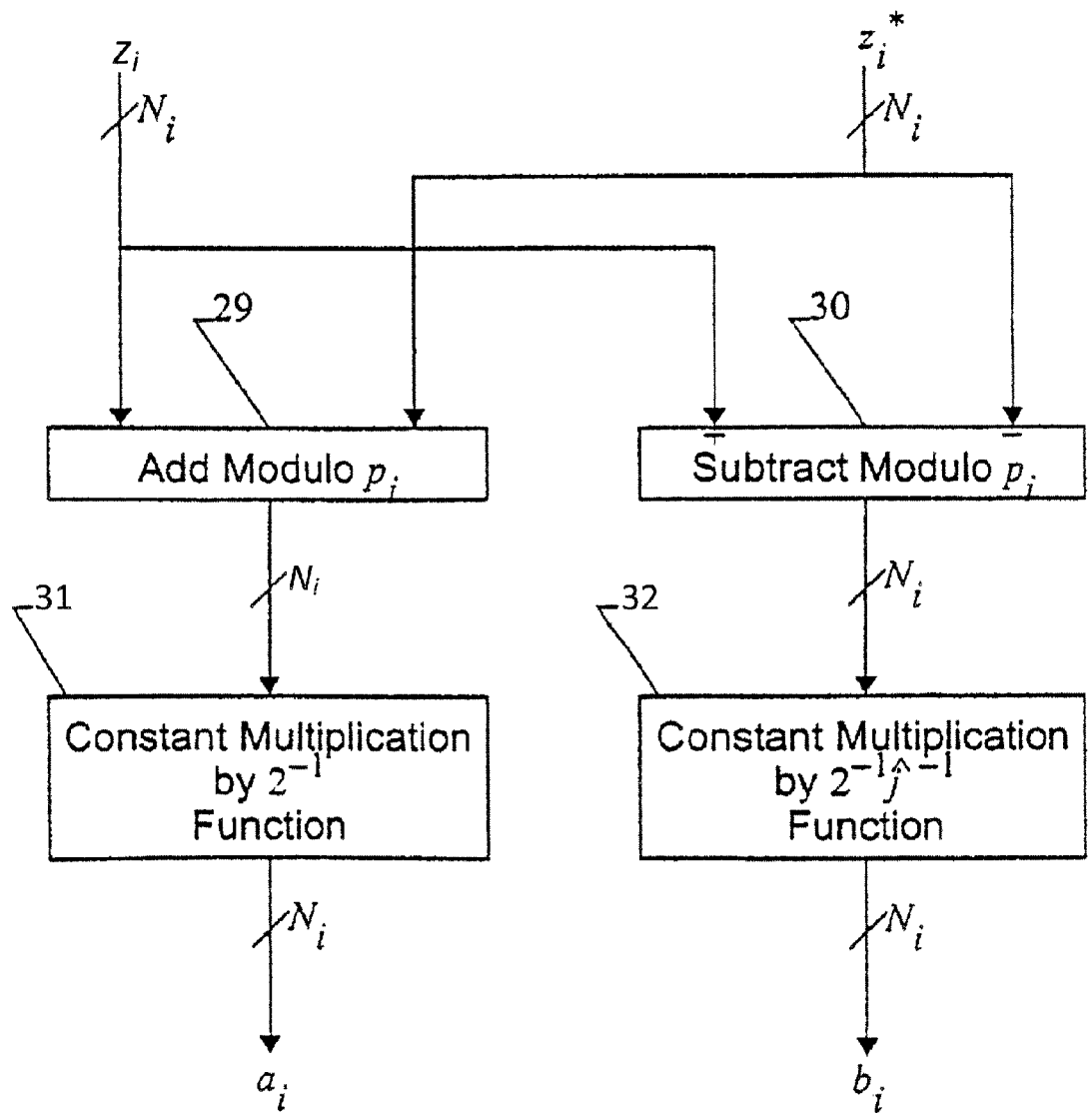
FIG. 12 shows a structure to convert a QRNS value to a complex RNS value.

Referring to the embodiment shown in FIG. 2, the subject invention can process complex operands. Data operands, for example, in a conventional form such as two's complement, can be input to circuit 1 (the details of which are summarized in the discussion of FIG. 7) to convert the operands into CRNS form. The CRNS operands can be passed to a circuit 2 to convert the operands to QRNS format. An example of such a circuit 2 is shown in FIG. 11. If the algorithm requires multiplication, the products can be computed next by a circuit 3, which can comprise one or more elements from FIG. 3, and/or FIG. 5 and FIG. 6. Any sums, if required, can be computed next by a circuit 4, which can comprise two operand modular adders and, optionally, one or more modular adder trees as shown in FIG. 8. The specific arrangement of the arithmetic elements and intermediate storage elements, including, but not limited to, registers, latches, and RAMs, can be varied depending on the situation. For example, the arithmetic elements and intermediate storage elements may be arranged to implement functions including, but not limited to, convolution, correlation, finite impulse response filters, fast Fourier transforms, discrete cosine transforms, wavelet transforms, filter banks, cascaded integrator comb filters, digital receivers, and digital transmitters. The QRNS results of the computation can then be converted back to CRNS representation by a circuit 5, for example, as shown in FIG. 12. The CRNS results can then be converted to a conventional format such as two's complement by a circuit 6, which can comprise, for example, a CRT conversion as shown in FIG. 9 or an L-CRT conversion as shown in FIG. 10.

Figure 3:
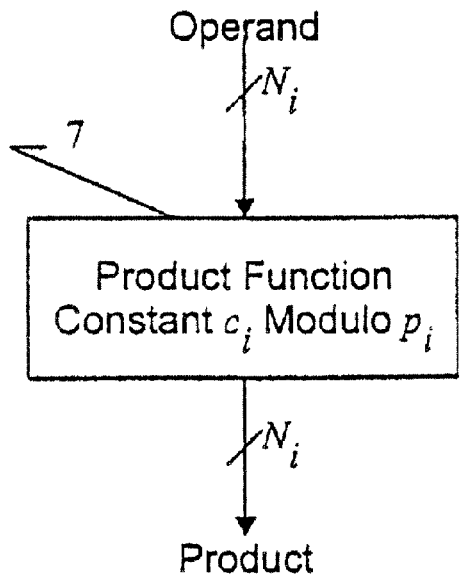
FIG. 3 shows a block diagram of a modular product table lookup for a constant multiplier.

An embodiment for computation of modular products of a constant and a modular data operand is shown in FIG. 3. The product can be generated by a circuit 7 that accepts an $N_i$ bit operand and produces the product of the operand and a constant $c_i$ modulo $p_i$, producing an $N_i$ bit result. FIG. 3 shows a block diagram of an embodiment of a circuit 7 to produce the modular product of an operand and a constant where such constant is fixed by the design of the circuit. Circuit 7 can utilize a plurality of logic gates selected by first computing the value of a multiply by a constant function for each possible modular data operand, then extracting the logical equations representing the computed values of the multiply by a constant function. The logical equations can then be mapped to a plurality of logic gates. If desired, prior to mapping to a plurality of logic gates, the logical equations can be minimized by, for example, using well-known logic minimization techniques which take advantage of the fact that for any invalid input the value of the output is allowed to be any value. After the logic equations is reduced to a minimized logical function, it can be mapped to an implementation utilizing a plurality of logic gates. Mapping to a plurality of logic gates can be performed, for example, manually or using software such as DESIGN COMPILER, available from Synopsys, Inc. of Mountain View, Calif.

Figure 4:
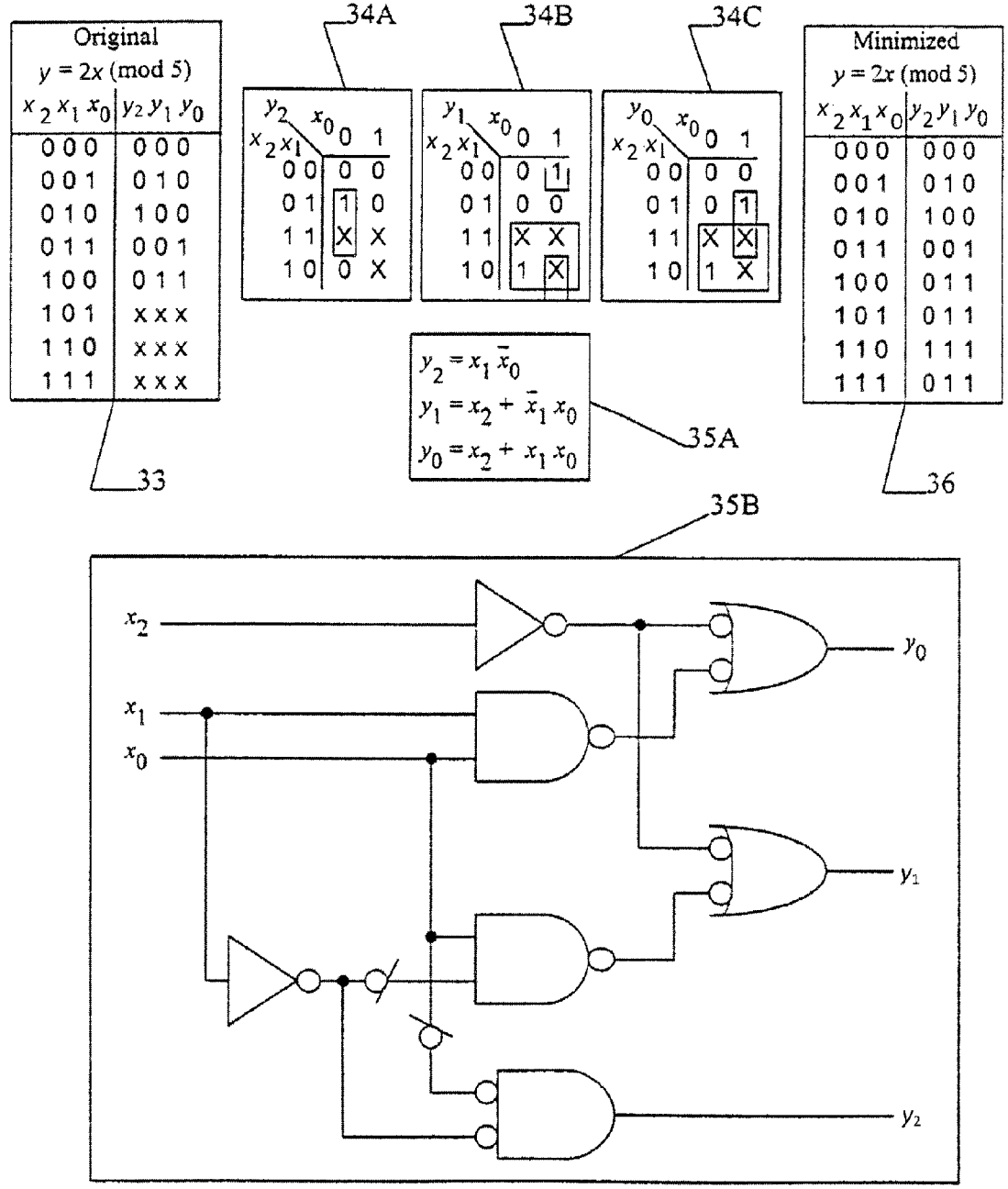
FIG. 4 shows a table for the product of two and a modulo 5 variable, modulo 5, the minimization of the equations for the table using Karnaugh maps, a plurality of logic gates implementing the reduced equations, and the resulting table.

FIG. 4 shows an example of a product lookup table for the constant multiplier 2 and a modulo 5 value x (bits $x_2$, $x_1$, and $x_0$, ordered from most significant to least significant). A truth table 33 shows all possible inputs to the table as well as the output of the table y (bits $y_2$, $y_1$, and $y_0$, ordered from most significant to least significant). The "x" entries in the table indicate that the value of the output can be anything. The table is reduced to a minimized set of logical equations 35A using Karnaugh maps 34A, 34B, and 34C. One example of a plurality of logic gate 35B which can be used to implement the logical equations 35A are shown in FIG. 4. For larger moduli, and thus larger tables, minimization of the logical equations for the table by manual means can be impractical, so a computer program can be employed to minimize the logical equations. The results of the minimized logical equations, given all possible inputs are shown in a truth table 36.

Figure 5:
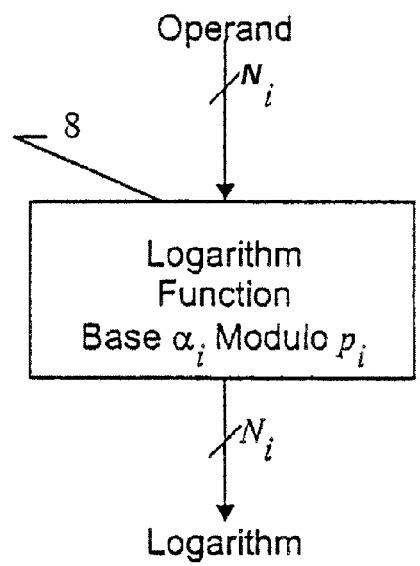
FIG. 5 shows a number theoretic logarithm lookup table.

An embodiment for computation of number theoretic logarithms for a given base $\alpha_i$ and modulus $p_i$ is shown in FIG. 5. To multiply two operands in the RNS, the logarithms of the operands can be computed by a circuit 8 as shown in FIG. 5. The logarithm can be generated by a circuit 8 that accepts an $N_i$ bit operand and produces the $N_i$ bit logarithm of the operand. If the input operand is zero then the output of the circuit 8 is a symbol that is not a valid number theoretic logarithm.

FIG. 5 shows a block diagram of an embodiment of a circuit 8 to produce the number theoretic logarithm of a residue, or a special zero symbol if the input operand is zero. For a given base $\alpha_i$ and modulus $p_i$, the number theoretic logarithm of a value in the set $\{1, 2, 3, \ldots, p_i-1\}$ will lie in the set $\{0, 1, 2, \ldots, p_i-2\}$. In the preferred embodiment of circuit 8, the special symbol that results when the input is zero is the binary word that is all ones. The table lookup function 8 can be reduced to a circuit using the procedure discussed in the description of FIG. 3.

Figure 6:
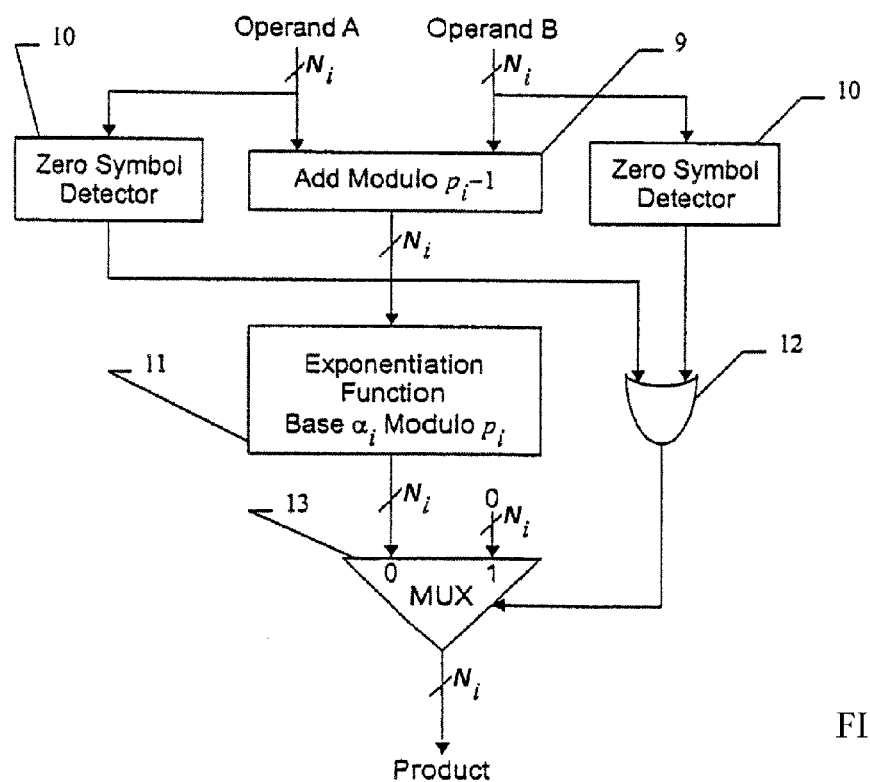
FIG. 6 shows a block diagram of a multiplier that computes products using the number theoretic logarithms of the operands.

FIG. 6 shows a block diagram of an embodiment of a circuit to compute the product of two residues, modulo $p_i$, using the sum of the number theoretic logarithms of the operands. The circuit of FIG. 6 can accept two operands, the number theoretic logarithms of the residues to be multiplied or the symbol for zero that is produced by a circuit 8 when presented with an input of zero. The operands car be presented to a modular adder circuit 9, which produces the sum of the operands modulo $p_i-1$, the output of which is valid only if neither of the operands is the zero symbol. The operands can also be presented to a circuit 10 to detect the symbol for zero. The sum of the logarithms produced. by the circuit 9 can then be an input to a number theoretic exponentiation table loolcup circuit 11. The table loolcup function 11 can be reduced to a circuit using the procedure discussed in the description of FIG. 3. The output of the zero detection circuits 10 can then be logically ORed by, for example, an OR gate 12. If the output of the OR gate 12 indicates that either of the input operands were the zero symbol, then the output of a multiplexer 13 can be set to zero, otherwise the output of the exponentiation circuit 11 can then be passed to the output of the multiplexer. In most implementations of the systems shown in FIG. 1 and FIG. 2, the number theoretic exponentiation table lookup circuit 11 will be the most common table lookup in the system. In general, for a specific $(Z/p_iZ)\setminus 0$, there are many possible generators. For any modulus $p_i$, there may be as much as a twenty percent variation in the size of the exponentiation circuit over the entire set of possible generators. Accordingly, generators can he selected based on one or more factors. In a preferred embodiment of the subject invention, for each modulus $p_i$, an optimum generator $\alpha_i$ can be selected based on one or more criterion such as size, speed, power, or some other cost function. This optimum generation can then be used to create the number theoretic, exponentiation circuit 11 and/or the number theoretic logarithm circuit 8.

In the embodiments shown in FIG. 6, the logarithms of the operands are checked by a zero detection circuit 10; if either of the logarithm inputs are the special symbol for zero, as determined by a logical OR gate 12, then the product output is set to zero by a multiplexer 13. Otherwise, the logarithms can be added modulo $p_i-1$ by a modular adder circuit 9, the output of which can be input to an exponentiation circuit 11. The output of the exponentiation circuit 11, can then be passed to the multiplexer 13, and if neither of the operands were the special zero symbol, as determined by the output of the OR gate 12, then the output of the multiplexer 13 can be set to the output of the exponentiation circuit 11.

Figure 7:
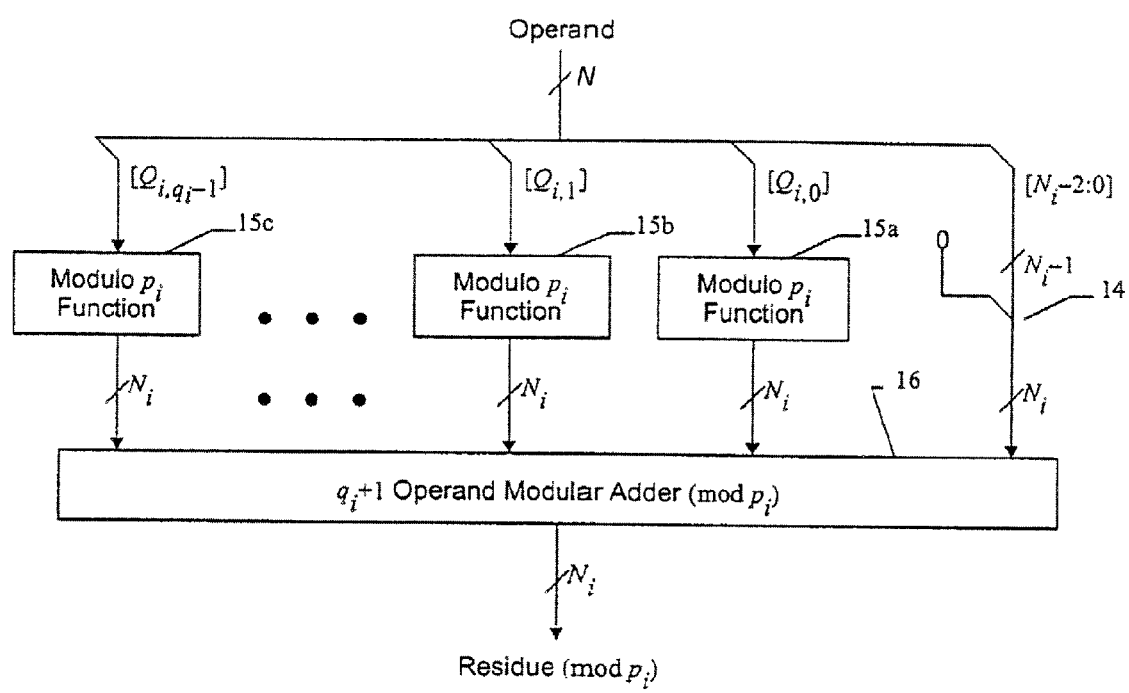
FIG. 7 shows a structure to compute the residue of an N bit unsigned or two's complement number.

FIG. 7 shows a block diagram of an embodiment for reduction of an N bit binary operand to its residue modulo $p_i$. This binary operand can be, for example, unsigned or two's complement. A zero extension 14 can take the least significant $N_i-1$ bits of the input operand and produce its $N_i$ bit residue modulo $p_i$. The N bit conventional operand can be partitioned into $q_i-1$ groups of bits. The $N_i-1$ least significant bits are already reduced modulo $p_i$, but are zero extended to $N_i$ bits by a zero extension 14. The remaining $N-N_i+1$ bits of the input operand can be partitioned into $q_i$ groups of bits which are inputs to $q_i$ table lookups 15A, 15B, and 15C. Each partition of bits $Q_{ij}$ for $j \in \{0, 1, 2, \ldots, q_i-1\}$ can be input to a table lookup circuit 15A, 15B, and 15C. Table lookups 15A, 15B, and 15C can then produce the residues of the weighted inputs. The mathematical functions performed by table lookups 15A, 15E, and 15C, can be reduced to circuits using the procedure discussed in the description of FIG. 3. The $q_i+1$ residues can be added by a $q_i+1$ operand modular adder 16 to produce the residue of the original input operand modulo $p_i$. For example, the output of the splitter 14 and the table lookup circuits 15A, 15B, 15C can be added by a $q_i+1$ operand modular adder circuit 16, the sum of which is the original N bit operand reduced modulo $p_i$.

FIG. 8 shows a block diagram of an embodiment of a circuit to compute the sum of L>2 operands (L residues) modulo $p_i$. The L operands can be added by a binary adder tree 17 to produce the full sum of the L operands. For example, binary adder 17 can produce the $N_i+\lceil \log_2 L \rceil$ bit unsigned sum of the input operands. The $N_i-1$ least significant bits can be split from the full sum by a splitter 20 and zero extended to $N_i$ bits by a zero extension 21. As shown, the output of the binary adder 17 can be split by a bus splitter 20, and the most significant $\lceil \log_2 L \rceil-1$ bits passed to a modulo $p_i$ table lookup circuit 18, while the least significant $N_i-1$ bits are passed to a zero extension 21. The table lookup function 18 can be reduced to a circuit using the procedure discussed with respect to the embodiment of FIG. 3. The outputs of the modulo $p_i$ table lookup circuit 18 and the zero extension 21 are combined by a modulo $p_i$ adder 19, producing the sum of the L operands modulo $p_i$.

An embodiment of the subject invention can be utilized for conversion of an L operand RNS value to a conventional value using the Chinese remainder theorem. FIG. 9 shows a block diagram of an embodiment of a circuit to convert the L residue representation of a value to its unsigned binary representation by the Chinese remainder theorem. The L residues, $\{x_0, x_1, x_2, \ldots, x_{L-1}\}$ can be input to L separate CRT function table lookup circuits 22A, 22B, 22C, and 22D, producing L results. The table lookup functions 22A, 22B, 22C, and 22D, can be reduced to circuits using the procedure discussed in the description of FIG. 3. These results modular adder circuit 23 to produce, for example, the unsigned binary representation of the input value.

An embodiment of the subject invention can be utilized for conversion of an L operand RNS value to a conventional value using L-CRT. FIG. 10 shows a block diagram of an embodiment of a circuit to convert the L residue representation of a value to a scaled unsigned binary or two's complement representation using the L-CRT conversion. The L residues, $\{x_0, x_1, x_2, \ldots, x_{L-1}\}$ can be input to L separate L-CRT function table lookup circuits 24A, 24B, 24C, and 24D, producing L scaled results. The table lookup functions 24A, 24B, 24C, and 24D, can be reduced to circuits using the procedure discussed in the description of FIG. 3. These results produced by the table lookup circuits 24A, 24B, 24C, and 24D can then be added by a binary adder circuit 25 to produce, for example, the scaled unsigned binary or two's complement representation of the input value.

An embodiment of the subject invention can be utilized for conversion of CRNS operands to QRNS form. FIG. 11 shows a block diagram of an embodiment of a circuit to convert a complex residue number system (CRNS) value to a quadratic residue number system (QRNS) value. The imaginary component of the CRNS input $b_i$, can be input to a constant multiplication by $\hat{j}$ circuit 26. For example, the imaginary residue operand, $b_i$, can be input to a circuit 26 that looks up the product of the operand with $\hat{j}$. The table lookup function 26 can he reduced to a circuit using the procedure discussed with respect to the embodiment of FIG. 3. The output of the table lookup circuit 26 and the real portion of the CRNS input, $a_i$, can be added modulo $p_i$, by a modular adder circuit 27 to produce the QRNS component $z_i$. The output of the table lookup circuit 26 can then be subtracted, modulo $p_i$, from the real portion of the CRNS input by a modular subtractor circuit 28 to produce the QRNS component $z_i^*$.

An embodiment of the subject invention can be utilized for conversion of QRNS operands to CRNS form. FIG. 12 shows a block diagram of an embodiment of a circuit to convert a quadratic residue number system value to a complex residue number system value. The QRNS components $z_i$ and $z_i^*$ can be added modulo $p_i$ by a modular adder circuit 29. The QRNS component $z_i^*$ can be subtracted, modulo $p_i$, from the component $z_i$ by a modular subtractor circuit 30. The output of the modular adder circuit 29 can be input to a constant multiplication by $2^{-1}$ table lookup circuit 31, the output of which is the real component of the CRNS representation of the data. The output of the modular adder 29 can be the input to a circuit 31 that looks up the product of the sum with $2^{-1}$. The output of the modular subtractor circuit 30 can be input to a constant multiplication by $\hat{j}^{-1}2^{-1}$ table lookup circuit 32, the output of which is the imaginary component of the CRNS representation of the data. The output of the modular subtractor 30 can be the input to circuit 32 that looks up the product of the sum with $\hat{j}^{-1}2^{-1}$. The product table lookup functions 31 and 32 can be reduced to circuits using the procedure discussed with respect to the embodiment of FIG. 3.

The use of logic gates to implement various table lookup operations in accordance with this invention can provide manifold advantages over the previous method of using memory devices. The use of logic gates can allow RNS computational circuitry to be efficiently implemented in a variety of technologies, some of which would not have been previously amenable to the use of RNS techniques. Additionally, the use of logic gates rather than memories for RNS computational circuitry can provide one or more of the following benefits: logic gates implemented in complimentary metal oxide semiconductor (CMOS) static logic can consume very low power in the absence of switching activity in the circuit; logic gates can scale directly into deep sub-micron semiconductor fabrication technologies; logic gates can be compatible with standard logic test methodologies; groups of logic gates can be optimized for speed, power, and area; groups of logic gates can be easily pipelined through manual or automatic means; and logic gates can reduce interference with the routing of wires on a semiconductor device as compared with memories.

Unlike memories, which have a fixed area and speed for any given table lookup function of a given input and output size, groups of logic gates can be minimized for the specific table lookup function to be implemented. In many cases, the logic function to be minimized can have some underlying structure that is not obvious from inspection of the table. This structure can lead to significant area and speed advantages for groups of logic gates over memories. For example, a table lookup for the product of an eight bit input modulo 241, and $2^{-1}$, modulo 241, produced in a read only memory (ROM) in a 0.2 micron standard cell application specific integrated circuit (ASIC) process requires the equivalent area of 2,250 gates, and at 100 MHZ and has a power dissipation of 3.6 mW, while the same table produced as gates requires only the area of 36 gates, and at the same speed has a power dissipation of 0.23 mW. Another table of the same size, an exponentiation table modulo 241, requires only an area of 675 gates, and at the same speed has a power dissipation of 1.3 mW.

These results were obtained using the process previously described, with respect to the embodiment of FIG. 3. The aforementioned ROM has a minimum clock period of 3.0 ns, while the aforementioned product lookup implemented as gates has a maximum delay from input to output of 1.0 ns, and the exponentiation lookup implemented as gates has a maximum delay of 3.0 ns. In the case of the exponentiation lookup, a delay of 1.2 ns can be achieved, although the area of the function is increased to 957 gates. This example is a compelling demonstration of the subject inventions ability to allow the optimization of the balance between speed, area, and power, by implementing RNS table lookups using logic gates rather than memories such as ROMs. For a given implementation technology, ROMs have the highest storage density of all the types of memory. For example, a static RAM implemented in the same technology as the aforementioned ROM, and with the same size and speed characteristics, requires the equivalent area of 3,660 gates. This example also demonstrates that by using logic gates to implement table lookup functions, area and speed may be traded to best suit the needs of a particular design.

It should be understood that the examples and embodiments described herein are for illustrative purposes only and that various modifications or changes in light thereof will be suggested to persons skilled in the art and are to be included within the spirit and purview of this application and the scope of the appended claims.

The invention claimed is:

1. A digital logic circuit for performing mathematical computations using residue arithmetic, comprising:
a means for converting residues from Complex Residue Number System to Quadratic Residue Number System, wherein each Complex Residue Number System residue comprises an imaginary residue operand, $b_i$, wherein the means for converting said residues from Complex Residue Number System to Quadratic Residue Number System comprises a means for multiplying the imaginary residue operand of the Complex Residue Number System input, $b_i$, by $\hat{j}$, wherein said means for multiplying the imaginary residue operand of the Complex Residue Number System input, $b_i$ by $\hat{j}$ comprises a plurality of logic gates, wherein the plurality of logic gates is selected by:
computing a value of the product of $b_i$, and $\hat{j}$, modulo $p_i$, for each possible modular data operand;
extracting logical equations representing computed values of the multiply by $\hat{j}$ function; and
mapping the logical equations to the plurality of logic gates.

2. A method of performing mathematical computations using residue arithmetic, comprising:
receiving input data in binary code, wherein the input data in binary code comprise binary operands having a plurality of bits; and
converting the input data in binary code to residues, wherein converting the input data in binary code to residues comprises computing residue modulo $p_i$, values of at least one subgroup of the plurality of bits of the binary operands utilizing a plurality of logic gates,
wherein the plurality of logic gates is configured such that when the at least one subgroup of the plurality of bits of the binary operands is input to the plurality of logic gates, the plurality of logic gates outputs residue modulo $p_i$ values of the at least one subgroup of the plurality of bits of the binary operands,
wherein logical equations representing the plurality of gates are equivalent to logical equations representing computed residue modulo $p_i$ values of the at least one subgroup of the plurality of bits of the binary operands for each possible binary operand.

3. A method of performing mathematical computations using residue arithmetic, comprising:
receiving input data in Complex Residue Number System residue format, wherein each Complex Residue Number System residue comprises an imaginary residue operand, $b_i$; and
converting the residues from Complex Residue Number System to Quadratic Residue Number System, wherein converting the residues from Complex Residue Number System to Quadratic Residue Number System comprises multiplying the imaginary residue operand of the Complex Residue Number System input, $b_i$ by $\hat{j}$ utilizing a plurality of logic gates,
wherein the plurality of logic gates is configured such that when each possible modular data operand is input to the plurality of logic gates the plurality of logic gates outputs a value of the product of $b_i$, and $\hat{j}$ modulo $p_i$ for each possible modular data operand, wherein logical equations representing the plurality of logic gates are equivalent to logical equations representing computed values of the multiply by $\hat{j}$ function of a value of the product of $b_i$, and $\hat{j}$ modulo $p_i$ for each possible modular data operand.

4. A method of performing mathematical computations using residue arithmetic, comprising:
receiving input data in residue format;
computing modular products of the residues, wherein computing modular products of the residues comprises computing a number theoretic logarithm, modulo $p_i$ for each of the residues the modular product of which is being computed utilizing a first plurality of logic gates,
wherein the first plurality of logic gates is configured such that when each possible residue of the residues the modular product of which is being computed is input to the first plurality of logic gates the first plurality of logic gates outputs a number theoretic logarithm, modulo $p_i$ for each possible residue of the residues the modular product of which is being computed,
wherein first logical equations representing the first plurality of logic gates are equivalent to first logical equations representing computed values of the number theoretic logarithm, modulo $p_i$ for each possible residue of the residues the modular product of which is being computed, and
computing a number theoretic exponent, modulo $p_i$, of the sum of the number theoretic logarithms of the residues utilizing a second plurality of logic gates,
wherein the second plurality of logic gates is configured such that when each possible sum of the number theoretic logarithms of the residues is input to the second plurality of logic gates the second plurality of logic gates outputs the number theoretic exponent, modulo $p_i$, for each possible sum of the number theoretic logarithms of the residues,
wherein second logical equations representing the second plurality of logic gates are equivalent to second logical equations representing computed values of the number theoretic exponent, modulo $p_i$, for each possible sum of the number theoretic logarithms of the residues.

5. A method of performing mathematical computations using residue arithmetic, comprising:
receiving input data in residue format; and
computing modular sums of the residues, wherein computing modular sums of the residues comprises producing a full sum of the residues, wherein the full sum of the residues has a plurality of bits corresponding to the full sum of the residues, and computing modulo $p_i$, values of at least one subgroup of the plurality of bits corresponding to the full sum of the residues utilizing a plurality of logic gates,
wherein the plurality of logic gates is configured such that when the at least one subgroup of the plurality of bits corresponding to the full sum of the residues is input to the plurality of logic gates the plurality of logic gates output residue modulo p, values for the at least one subgroup of the plurality of bits corresponding to the full sum of the residues, wherein logical equations representing the plurality of logic gates are equivalent to logical equations representing computed residue modulo $p_i$ values for each of the at least one subgroup of the plurality of bits corresponding to the full sum of the residues.

6. A method of performing mathematical computations using residue arithmetic, comprising:
   receiving input data in Quadratic Residue Number System residue format; and
   converting the residues from Quadratic Residue Number System to Complex Residue Number System, wherein converting the residues from Quadratic Residue Number System to Complex Residue Number System comprises:
   computing the product of $2^{-1}$ and the sum of the Quadratic Residue Number System residue, $z_i$, and $z_i^*$, wherein the product of $2^{-1}$ and the sum of the Quadratic Residue Number System residue, $z_i$, and $z_i^*$ is the real component of the Complex Residue Number System residue utilizing a first plurality of logic gates, wherein the first plurality of logic gates is configured such that when each possible sum is input to the first plurality of logic gates the first plurality of logic gates outputs value of the product of the sum of and $z_i$ and $z_i^*$, and $2^{-1}$ for each possible sum, wherein first logical equations representing the first plurality of logic gates are equivalent to first logical equations representing computed values of the multiply by $2^{-1}$ functions for each possible sum, and computing the product of $\hat{j}^{-1}2^{-1}$ and the difference, modulo $p_i$, $z_i$, minus $z_i^*$, wherein the product of $\hat{j}^{-1}2^{-1}$ and the difference, modulo $p_i$, $z_i$ minus $z_i^*$ is the imaginary component of the Complex Residue Number System residue utilizing a second plurality of logic gates, wherein the second plurality of logic gates is configured such that when each possible difference is input to the second plurality of logic gates the second plurality of logic gates outputs value of the product of $z_i$ minus $z_i^*$, and $\hat{j}^{-1}2^{-1}$, modulo $p_i$ of each possible difference, wherein second logical equations representing the second plurality of logic gates are equivalent to second logical equations representing computed values of the multiply by $\hat{j}^{-1}2^{-1}$ function for each possible difference.

7. A method of performing mathematical computations using residue arithmetic, comprising:
   receiving input data in residue format; and
   converting the residues to data in binary code, wherein each residue is an L residue, Residue Number System value, wherein converting the residues to data in binary code comprises applying the Chinese Remainder Theorem function or L-Chinese Remainder Theorem function to each of the L residues of each residue to produce L results and modularly adding the L results utilizing a plurality of logic gates,
   wherein the plurality of logic gates is configured such that when each possible residue input is input to the plurality of logic gates the plurality of logic gates outputs a value of a Chinese Remainder Theorem or L-Chinese Remainder Theorem function of each possible input,
   wherein logical equations representing the plurality of logic gates are equivalent to logical equations representing computed Chinese Remainder Theorem or L-Chinese Remainder Theorem values for each possible residue input.

* * * * *

UNITED STATES PATENT AND TRADEMARK OFFICE
CERTIFICATE OF CORRECTION

PATENT NO. : 8,965,943 B2
APPLICATION NO. : 13/471197
DATED : February 24, 2015
INVENTOR(S) : Jonathon D. Mellott It is certified that error appears in the above-identified patent and that said Letters Patent is hereby corrected as shown below:

In the specification

Column 1,
Line 67, "issued. Apr." should read --issued Apr.--.

Column 3,
Line 41, "wires or the" should read --wires on the--.

Column 4,
Line 40, "to X" should read --to x--.

Column 5,
Line 2, "Z[j]/(f+1)" should read --Z[j]/(j$^2$+1)--.
Lines 4-5, "(Z[j]/(f÷1))/p$_i$Z," should read --(Z[j]/(j$^2$+1))/*p$_i$Z*--.

Column 8,
Line 8, "produced. by" should read --produced by--.
Line 10, "loolcup circuit" should read --lookup circuit--.
Line 10, "loolcup function" should read --lookup function--.
Lines 30-31, "theoretic, exponentiation" should read --theoretic exponentiation--.
Line 50, "q$_i$-1 groups" should read --q$_i$+1 groups--.
Line 60, "15E, and 15C," should read --15B, and 15C,--.

Column 9,
Line 10, "[log$_2$ L] - 1" should read --[log$_2$ L] + 1--.
Line 55, "can he reduced" should read --can be reduced--.

Signed and Sealed this
Seventeenth Day of November, 2015

Michelle K. Lee
*Director of the United States Patent and Trademark Office*

CERTIFICATE OF CORRECTION (continued)
U.S. Pat. No. 8,965,943 B2

<u>Column 10,</u>
Line 56, "described, with" should read --described with--.
Line 64, "inventions ability" should read --invention's ability--.

In the claims

<u>Column 11,</u>
Line 44, "$p_i$, values" should read --$p_i$ values--.

<u>Column 12,</u>
Line 7, "$\hat{j}$ modulo $p_i$" should read --$\hat{j}$, modulo $p_i$--.
Line 12, "$\hat{j}$ modulo $p_i$" should read --$\hat{j}$, modulo $p_i$--.
Line 19, "$p_i$ for" should read --$p_i$, for--.
Line 65, "p, values" should read --$p_i$ values--.

<u>Column 13,</u>
Line 24, "$z_i$ and $z_i^*$," should read --$z_i$, and $z_i^*$,--.